(12) United States Patent
Lewis

(10) Patent No.: US 7,145,978 B2
(45) Date of Patent: Dec. 5, 2006

(54) HIGH SPEED BINARY COUNTER

(76) Inventor: James M. Lewis, 11405 Alabama Highway 33, Moulton, AL (US) 35650

( * ) Notice: Subject to any disclaimer, the term of this patent is extended or adjusted under 35 U.S.C. 154(b) by 120 days.

(21) Appl. No.: 10/989,504

(22) Filed: Nov. 17, 2004

(65) Prior Publication Data

US 2006/0104405 A1    May 18, 2006

(51) Int. Cl.
    *H03K 21/16*    (2006.01)
(52) U.S. Cl. .................... 377/116; 377/106; 377/111
(58) Field of Classification Search .............. None
    See application file for complete search history.

(56) References Cited

U.S. PATENT DOCUMENTS

| | | | | |
|---|---|---|---|---|
| 4,679,216 | A * | 7/1987 | Iida et al. ............... | 377/116 |
| 4,741,005 | A * | 4/1988 | Tanigawa ............... | 377/115 |
| 5,060,243 | A * | 10/1991 | Eckert ..................... | 377/28 |
| 5,526,393 | A * | 6/1996 | Kondo et al. ........... | 377/118 |
| 6,445,760 | B1 | 9/2002 | Weintraub et al. ..... | 377/48 |
| 2002/0075989 | A1 | 6/2002 | Joo ......................... | 377/33 |

OTHER PUBLICATIONS

Larsson, P. et al., "Novel carry propagation in high-speed synchronous counters and dividers" ELECTRON LETT 29, 16, 1457-1458 (1993).

Misra, S.K. et al., "VLSI implementation of a 300-MHz 0.35-µ mCMOS . . .", PROC IEE INT CONF VSLI DES, 326-329 (1998).

Elliott, A.R., "High-Speed binary rate-multiplier", PROC IEEE 59, 8, 1256-8 (1971).

Pekmestzi, K.Z. et al., "Systolic frequency dividers/counters", IEEE Trans Circuits Syst II Analog Digital 41, 11, 775-776 (1994).

Anetseder, L., "Binary counter for high speeds", ELEKTRONIK 20, abstract (1971).

Ramachandran, P., "New technique for designing high-speed frequency counters", IEE TRANS INSTRUM MEAS IM-22, abstract (1973).

Blatov, V. et al., "High-speed reversible decAde counter", INSTRUM EXP TECH 21, abstract (1978).

Sheredeka, A.A., "High-speed binary em dash quinary pulse counter using integrated microcircuits", INSTRUM EXP TECH 18, abstract (1975).

* cited by examiner

*Primary Examiner*—Tuan T. Lam
(74) *Attorney, Agent, or Firm*—Welsh & Flaxman LLC

(57) ABSTRACT

A high speed binary counter includes a counting first flip-flop for each binary bit, a single AND gate for each lower order binary bit beyond B0 and B1, and at least two AND gates for each higher order binary bit. The counter also includes an input factor delay second flip-flop. The counter is further provided with a mechanism for redundant least significant terms for lesser order bits.

40 Claims, 6 Drawing Sheets

Binary Counter implemented with Input Factor Delay and Redundant Least Significant Terms

| Decimal Equivalent | B3 | B2 | B1 | B0 |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |

Decimal and binary counting

FIG. 1

Partial binary counter using "D" flip flops

Partial binary counter using "Toggle" flip flops

Ideal Binary Counting Example

B7 Counter output implemented with Input Factor Delay

B11 Binary Counter output implemented with Input Factor Delay

Binary Counter implemented with Input Factor Delay and Redundant Least Significant Terms Timing Diagram example of Input Factor Delay

HIGH SPEED BINARY COUNTER

BACKGROUND OF THE INVENTION

1. Field of the Invention

The invention relates to a high speed binary counter. More particularly, the invention relates to a high speed binary counter optimized to run faster and provide higher accuracy. This is achieved through the implementation of additional flip-flops and AND gates for higher order input terms of the binary counter.

2. Description of the Prior Art

With reference to FIG. 1, a comparison of decimal to binary counting is provided. Binary counting is commonly achieved through the use of a binary counter. A binary counter is a digital circuit having a clock input and a number of count outputs that give the number of clock cycles. The output may change either on rising or falling clock edges. The circuit may also have a reset input that sets all outputs to zero when asserted. The binary counter may be either a synchronous counter or a ripple counter. In order to produce a binary counter, a system of sequential logic is implemented with a digital flip-flop for each binary bit (that is, the B0 output is implemented with one flip-flop, the B1 output is implemented with one flip-flop and so on). The sequential logic is able to count by generating the proper input value to the flip-flop to produce the desired output at the time of the clock input rising edge.

Many techniques are known for creating high speed binary counters. As those skilled in the art will appreciate, one such technique employs a D flip-flop with gate logic on the D input of the flip-flop. Another technique employs "toggle" (or T) flip-flops with gate logic on the T input of the flip-flop.

As those skilled in the art will certainly appreciate, a flip-flop is a bistable gate having two stable states. The flip-flop maintains its states indefinitely until an input pulse, called a trigger, is received. When a trigger is received, the flip-flop outputs change their states according to defined rules, and remain in those states until another trigger is received. There are several different kinds of flip-flop circuits, including, but not limited to, D and T flip-flops as employed in accordance with the present invention. Flip-flop circuits are interconnected to form the logic gates that comprise digital integrated circuits (ICs) such as memory chips and microprocessors.

With reference to FIG. 2, the first four bits of a common binary counter are shown. FIG. 2 shows the binary counter implemented through the utilization of D flip-flops. The enable, set and reset inputs of the flip-flops have been removed for illustration clarity and those skilled in the art will certainly appreciate how they function in accordance with this explanation. In the case of a counter implemented with D flip-flops, the D input is the flip-flop output exclusive ORed (XOR) with the product of all lower order outputs. For example:

$$B3.d = B3\,XOR(B2\,AND\,B1\,AND\,B0)$$

For every case:

$$Bn.d = Bn\,XOR(B(n-1)\,AND\,B(n-2)\ldots AND\,B0)$$

For the case B0, it can be shown that the inverter between the D input and the flip-flop output is equivalent to an exclusive OR gate with one input tied high (true).

The problem that limits the speed of the counter is the AND gate that grows with the number of bits of the counter and the routing problems associated with transmitting lower order bit information to the AND gates. Sixteen-bit counters are common, requiring a 15-input AND gate to implement the MSB (Most Significant Bit). 32-bit counters are not unusual in modern electronics, requiring a large number of very wide AND gates. The routing and switching delays of these gates limit the speed at which the counter can operate.

As those skilled in the art will certainly understand, the most significant bit is the bit in a multiple-bit binary number with the largest value. This is usually the bit farthest to the left in numerical representation, or the bit transmitted first in a sequence. For example, in the binary number 1000, the MSB is 1, and in the binary number 0111, the MSB is 0.

High speed binary counters implemented with toggle, or T, flip-flops suffer from the same problems. With reference to FIG. 3, the first four bits of a binary counter are shown implemented with toggle flip-flops. As in the case of the D flip-flop version, each more significant bit requires a larger AND gate. B3 requires a three-input AND gate on the Toggle input, B4 requires a four-input AND gate, and so on. As such, a 32-bit counter will require a 31-input AND gate on its MSB.

The equation for the T input may be expressed as:

$$Bn.t = B(n-1)\,AND\,B(n-2)\ldots AND\,B0$$

Those skilled in the art will appreciate the B1 and B0 inputs can also be derived from this equation.

The binary counter implemented with the T flip-flops, therefore, suffers from the same limitations as the D flip-flops discussed above. It may further be implied that any binary counter designed from any type of memory cell (whether any kind of flip-flop or other device) suffers from this same problem of incrementally larger AND gates and greater signal routing requirements as the number of bits grows.

When using a binary counter, it is advantageous to use a counter that increments in orderly binary format so a format conversion is not required. Counters are well known that count in Gray code format. These counters offer some advantage in operating speed. Ultimately, the output of these counters must be converted to binary format. This Gray code to binary conversion expends logic resources and time. A counter that can increment as rapidly as possible in true binary format is desirable.

With this in mind, FIG. 4 shows the transitions of an ideal binary counting process for the values 241 through 259. In this ideal system, there are no propagation or transport delays for the combinational logic or any transition delays for the sequential logic. All of the signals transition at exactly the same time.

FIG. 4 illustrates, however, the problem with the utilization of a large AND gate. Specifically, the 8-input AND gate that provides input to the B8 flip-flop is exemplary of the problems associated with the use of larger AND gates. There are two problems that occur in the Region of Interest indicated in FIG. 4. First, the input to the B8 flip-flop must be stable before the clock rising edge. In order to accomplish this, all of the input signals to the AND gate must be transported early enough to allow for the AND gate propagation delay and the flip-flop setup time.

Flip-flops require that the logical value on the input signal remain stable for some finite amount of time prior to the trigger pulse. If the input data changes at or close to the time of the trigger, the flip-flop may not capture the data or may become metastable. A metastable flip-flop's output may actually oscillate (change state) a few times before settling, at which point the settled output value has the same chances of assuming a logical value of 1 or 0 regardless of the input value. Therefore, insuring the proper set-up time is critical to implementing a reliable counter circuit.

All combinational logic gates require some finite amount of time to generate a valid output based on the input data. The amount of time a logic gate requires to generate a valid output is known as propagation delay. Combinational logic gates with more inputs typically cause more propagation delay. Similarly, electronic signals require some finite amount of time to travel through conductors from one part of a circuit to another. This travel time is known as transport delay. As a circuit becomes larger and more complicated the propagation delays and transport delays become greater.

The maximum speed (or frequency) at which a digital circuit can operate is influenced by the transport delays and propagation delays of the combinational logic and the set-up time of the flip-flops. If a counter operates at 100 MHz, the operational period of the counter is 1 second divided by 100,000,000, or 10 nano seconds. For a counter to operate reliably at 100 MHz, the maximum propagation delay plus the transport delay plus the set-up time must be less than 10 nano seconds (that is less than the period).

Flip-flop hold time (the time that the flip-flop input values must remain true after the trigger pulse) may also be considered in some systems, but is considered to be minimal or 0 in modern digital electronics.

The most critical input to the AND gate is the B0 output. The B0 signal has only one clock period to be routed from the output of its flip-flop to the input of the AND gate at B8. If there were only one route to account for, the routing would be trivial. The routing problem is complicated by the fact that the B0 signal must be routed to the input of every AND gate employed by the binary counter. Because of the demands of the system, one of the limitations to the speed of the counter is the worst case transport delay of the B0 signal throughout the system.

The second problem is the transition of the AND gate inputs from all logic "1"s to all "0"s. This transition requires the maximum propagation delay for some types of logic. Further, this logic transition is dependent on the transport delay of every less significant flip-flop. This means every signal route in the system becomes critical to the more significant bits. If the system is required to operate faster than the transport delays, a glitch can occur causing a false value in more significant bits. Routing delays are an important contributing factor to the speed of the counter.

In understanding the high speed binary counter of the present invention, which overcomes the limitations discussed above, two observations are important. First, the more significant bits have many clock cycles of time to be transported to the AND gate. Second, when the AND gate has all logic "1" inputs, the change of any single input is significant to change the gate output. For instance, in the FIG. 4 region of interest, if any of the B0 through B7 outputs changes to logic "0" prior to the next clock edge (also allowing for propagation delay), then the B8 flip-flop will respond properly.

With the foregoing in mind, a need exists for an improved high speed binary counter that is capable of counting faster with higher accuracy. The present invention provides such a high speed binary counter.

SUMMARY OF THE INVENTION

It is, therefore, an object of the present invention to provide a high speed binary counter. The counter includes a counting first flip-flop for each binary bit, a single AND gate for each lower order binary bit beyond B0 and B1, and at least two AND gates for each higher order binary bit.

It is also an object of the present invention to provide a high speed binary counter wherein each first flip-flop is a D flip-flop.

It is another object of the present invention to provide a high speed binary counter wherein each first flip-flop is a toggle flip-flop.

It is a further object of the present invention to provide a high speed binary counter including an input factor delay second flip-flop wherein each first flip-flop is a toggle flip-flop and each second flip-flop is a D-flip-flop.

It is a further object of the present invention to provide a high speed binary counter including an input factor delay second flip-flop wherein each first flip-flop is a D flip-flop and each second flip-flop is a D-flip-flop.

It is still an object of the present invention to provide a high speed binary counter wherein the lower order binary bits beyond B0 and B1 are B2, B3 and B4.

It is yet another object of the present invention to provide a high speed binary counter wherein the higher order binary bits are B5 and above.

It is also an object of the present invention to provide a high speed binary counter including means for redundant least significant terms for lesser order bits.

It is a further object of the present invention to provide a high speed binary counter where the means for redundant least significant terms includes replication of term B0 for all counter terms of the binary counter.

It is also another object of the present invention to provide a high speed binary counter wherein the means for redundant least significant terms includes replication of term B1 for all counter terms of the binary counter.

It is still a further object of the present invention to provide a high speed binary counter including a counting first flip-flop for each binary bit, a single AND gate for each lower order binary bit beyond B0 and B1, and a means for partial input factor delay for each higher order binary bit.

It is also an object of the present invention to provide a high speed binary counter wherein the means for partial input factor delay is a second AND gate applied to each higher order binary bit and an input factor delay second flip-flop.

It is another object of the present invention to provide a high speed binary counter wherein the means for partial input factor delay is a second AND gate applied to each higher order binary bit and a second flip-flop which is a D flip-flop.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 1 is a table comparing decimal and binary counting.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limited, but merely as the basis for the claims and as a basis for teaching one skilled in the art how to make and/or use the invention.

Figure 2:
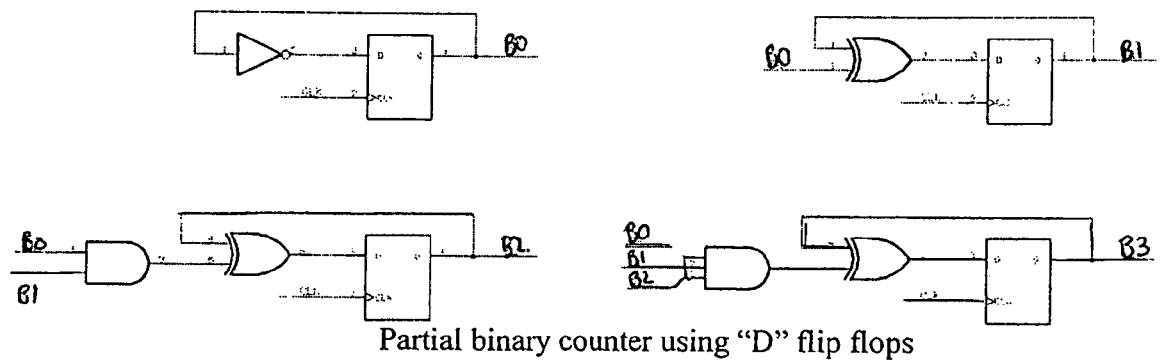
FIG. 2 is a schematic showing the first four bits of a binary counter implemented with D flip-flops.
Figure 3:
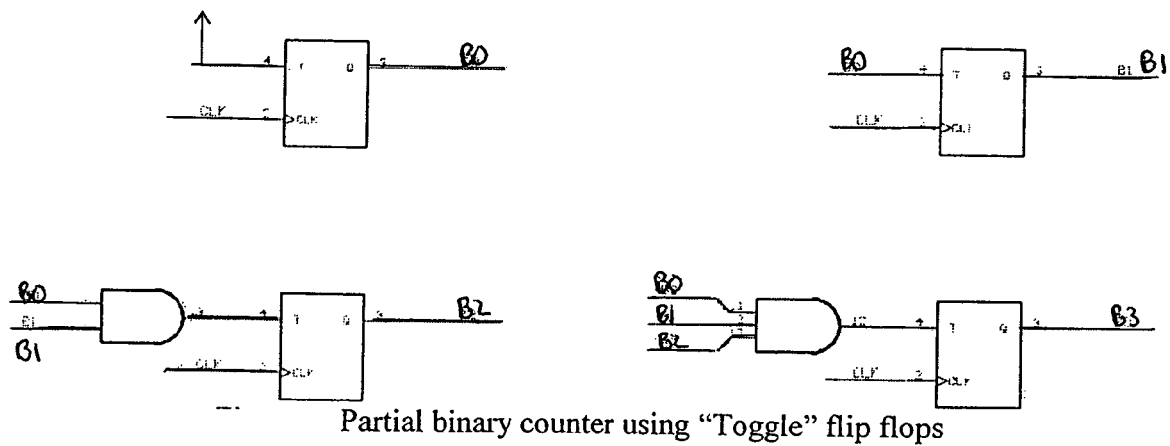
FIG. 3 is a schematic showing the first four bits of a binary counter implemented with T flip-flops.
Figure 4:
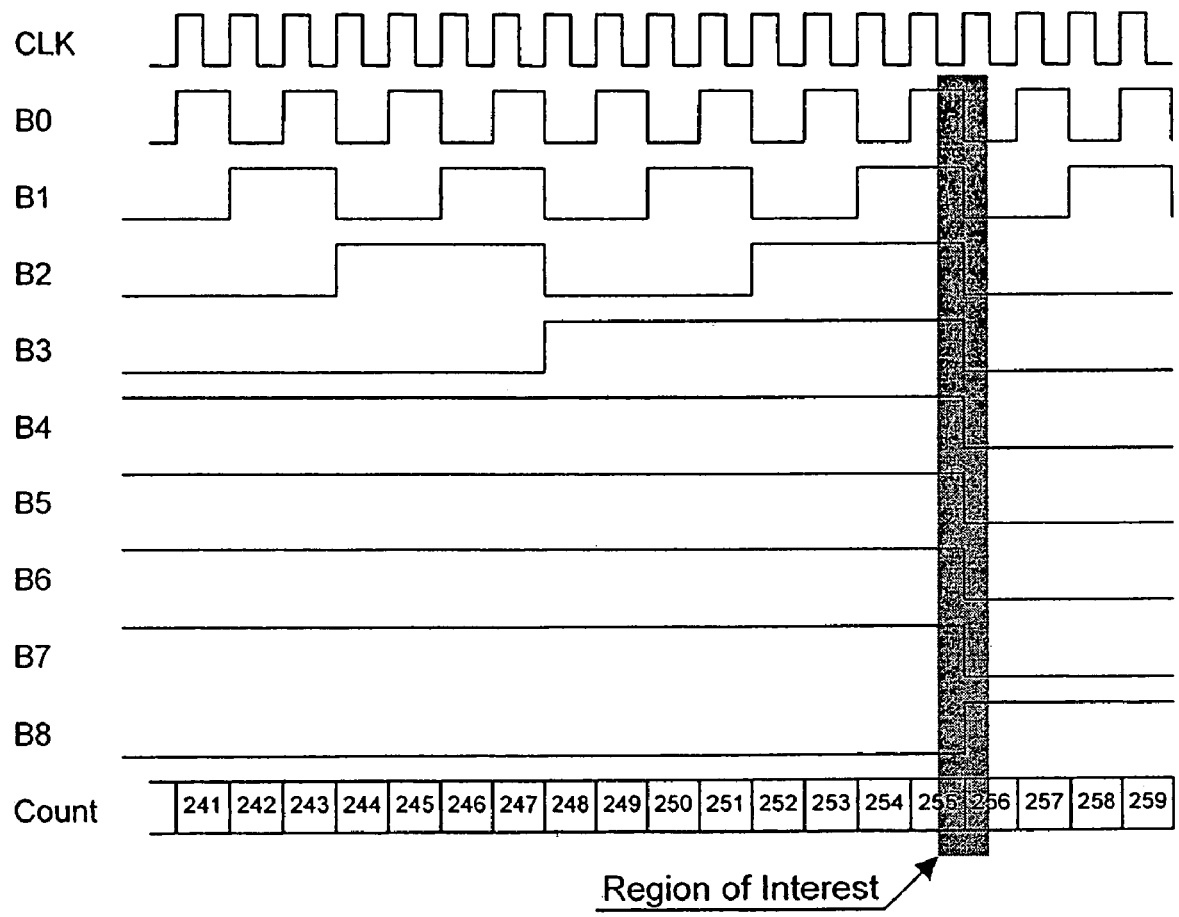
FIG. 4 presents an example of ideal binary counting.
Figure 5:
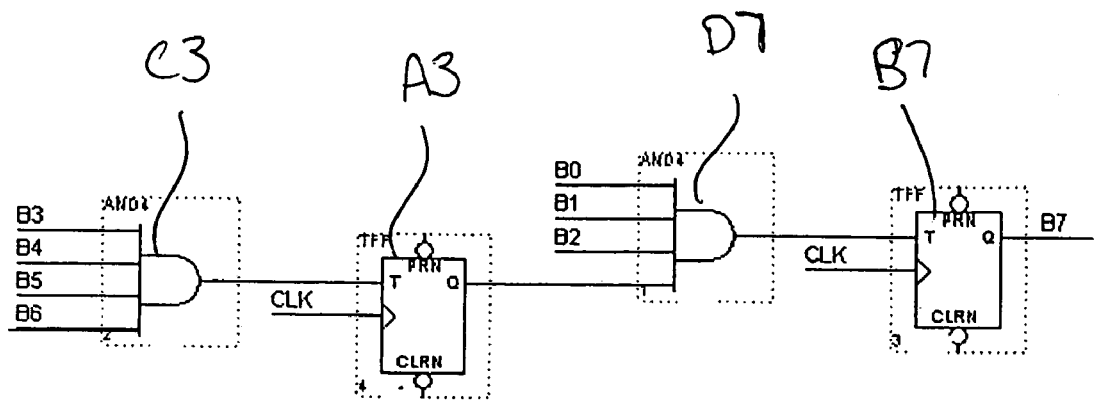
FIG. 5 is a schematic showing implementation of the present high speed binary counter for the B7 term.
Figure 6:
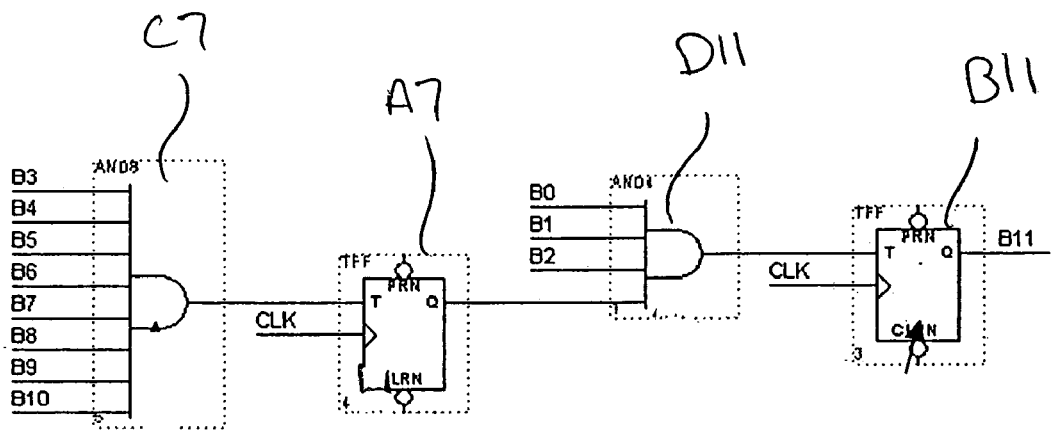
FIG. 6 is a schematic showing implementation of the present high speed binary counter for the B11 term.
Figure 7:
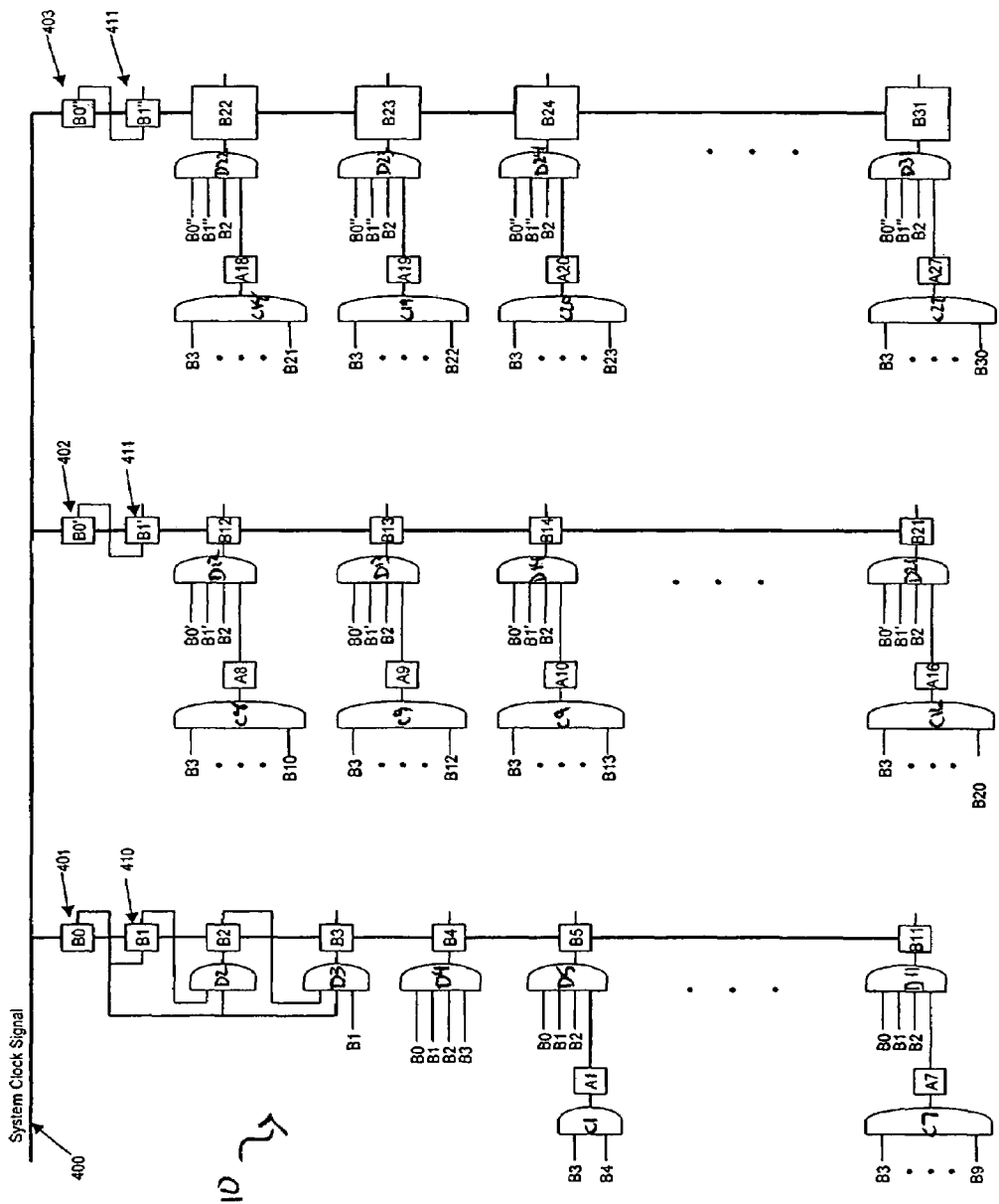
FIG. 7 is a 32 bit binary counter in accordance with the present invention.

With reference to the FIGS. 5, 6, and 7, the present high speed binary counter 10 is disclosed. The present high speed binary counter 10 overcomes the limitations of the prior art by providing a binary counter that operates faster, (particularly in programmable logic systems) and operates with greater accuracy. As many of the components employed in accordance with the present invention are substantially similar for the various binary terms, similar numerals will be used when referring to similar components. In addition, the name of the output signal of each counting flip-flop shares the name of the flip-flop (that is, signal B0 is the output of counter flip-flop B0, etc.). Signal connections are shown by naming convention in some cases and by routing convention in other cases.

Briefly, the present high speed binary counter 10 employs a series of flip-flops and AND gates to define a system capable of outputting binary data following a predetermined order in response to sequential input pulses. The present high speed binary counter 10 includes a counting flip-flop B0–B31 for each binary bit (B0, B1, B2 etc.), a single first AND gate D2, D3, D4 for each lower order binary bit beyond B0 and B1 (for example, B2, B3 and B4), and a mechanism for partial input factor delay for each higher order binary bit (for example B5, B6, B7 etc.), wherein the mechanism for partial input factor delay is a second AND gate C1–C27 applied to each higher order binary bit B5–B31.

The high speed binary counter 10 may include D flip-flops or T flip-flops. In accordance with a preferred embodiment of the present invention, the lower order binary bits are B2, B3 and B4, and the higher order binary bits are B5 and above. The high speed binary counter 10 further includes a mechanism for redundant least significant terms for lesser order bits. In particular, the mechanism for redundant least significant terms includes replication of terms B0 and B1 for all counter terms of the binary counter 10.

As will be discussed below in greater detail, the present high speed binary counter 10 overcomes the limitations of the prior art by simplifying the AND gate at each higher order counting flip-flop to reduce the critical signal transport delays. This is accomplished by adding an additional input delay flip-flop A1–A27 and a second AND gate C1–C27 to the higher order inputs for each term. In accordance with the present disclosure, this technique is referred to as "partial input factor delay" or "input factor delay" throughout the body of the present application.

In addition to the use of additional input delay flip-flops and second AND gates for the higher order inputs for each term, the present high speed binary counter 10 provides for multiple copies of lesser order bits (that is, redundant least significant terms) to eliminate some of the routing demands on the lowest order signals (B0, B1, B2). Most importantly, B0 is critical to all counter terms and changes fastest. As such, and in accordance with the present invention, B0 must be replicated. B1 may also be replicated. However, the B1 term transitions half as fast as B0, and so has more time for signal transport delayed in accordance with the underlying concepts of the present invention. B2 transitions only once per every four delays. B2 transitions only once per every four B0 transitions and so it not nearly as critical as B0 in the operation of the present binary counter.

With regard to the addition of an input delay flip-flop A1–A27 and second AND gate C1–C27 to the higher order inputs for each term, it should be understood the higher order inputs are in the proper state (all logic "1"s) much earlier than the lower order inputs. As such, the additional signal clock cycle delay is insignificant prior to the term transition. Since the change in the lower order bits is significant to produce the logic "1" to logic "0" AND gate transition on the counting flip-flop input, the additional signal clock cycle delay is also insignificant after the term transitions.

Referring to FIGS. 5 and 6, the present invention is described with reference to the implementation of the terms B7 and B11 in accordance with the present input factor delay. In an ideal system, with no propagation or transport delays, these designs produce exactly the same result as implementation using only large AND gates to provide the T input term.

B7 is implemented through the provision of a second AND gate C3 provided with input from counting flip-flops B3, B4, B5 and B6, an input delay flip-flop A3, a first AND gate D7 provided with input from counting flip-flops B0, B1 and B2 and a counting T flip-flop B7. Similarly, term B11 is implemented through the provision of a second AND gate C7 provided with input from counting flip-flops B3, B4, B5, B6, B7, B8, B9 and B10, an input delay flip-flop A7, a first AND gate D11 provided with input from counting flip-flops B0, B1 and B2 and a counting T flip-flop B11.

Because the higher order terms are stable for long periods of time, and with reference to FIGS. 5 and 6, the second AND gate C3, C7 is stable for a relatively long period of time (multiple clock cycles) before critical transition time is reached. The input delay flip-flop A3, A7 also has multiple clock cycles of allowable delay while the lesser order bits prevent the first AND gate D7, D11 from producing a logic "1" input to the counting flip-flop B7, B11.

The designs depicted in FIGS. 5 and 6, respectively, utilize a 4-input AND gate for the first AND gate D7, D11, that is, the final combinational term, because 4-input logic is common (and often a limiting factor) in programmable logic and some ASIC (Application Specific Integrated Circuit) technologies. Many FPGAs (Field Programmable Gate Arrays), for example, use 4-input look-up tables as the primary combinational logic element. These examples illustrate this technique is suitable for systems with logic gates of limited width. As such, and as those skilled in the art will certainly appreciate, various input logic devices may be employed without departing from the spirit of the present invention.

Further, wider input logic gates are often implemented in programmable logic by combining multiple look-up tables. In many cases (for example, FPGAs) the logic is designed with one flip-flop per each look-up table. Utilizing the input delay flip-flop A3, A7 does not actually require more logic, since the look-up table for that logic element is required whether the flip-flop is utilized or not. When designing a counter system using input factor delay in accordance with the present invention, the input delay flip-flop A3, A7 of the counter output shown in FIGS. 5 and 6 can be placed close to the input term first AND gate D7, D11 of the counter output shown in FIGS. 5 and 6 and the counting flip-flop B7, B11 of the counter output shown in FIGS. 5 and 6 since the output of the input delay flip-flop A3, A7 only has to be routed to input term logic for its respective counting flip-flop B7, B11. Utilization of an additional input delay flip-flop A3, A7 and second AND gate C3, C7 as discussed above reduces the need for wider AND gates and optimizes operation of the present high speed binary counter.

As discussed above, the present high speed binary counter 10 provides for multiple copies of lesser order bits (Redundant Least Significant Terms) to eliminate some of the routing demands on the lowest order signals (B0, B1, B2). With reference to FIG. 7, a 32-bit binary counter 10 in accordance with the present invention is shown. The 32-bit binary counter implements input factor delay and redundant least significant terms as discussed herein. Although the disclosed counter is intended for implementation in an ASIC or Programmable Logic Device, the concepts underlying the present high speed binary counter may be applied in a variety of areas without departing from the spirit of the present invention.

In accordance with this preferred embodiment, the system clock signal 20 is routed throughout the system using dedicated resources to provide for minimal clock skew and delay. This type of resource is common in ASICs and FPGAs.

It should be noted the clock signal connection and flip-flop functions are simplified in FIG. 7 for the sake of clarity. That is, no set, reset, clear, preset, or enable inputs are shown. However, those skilled in the art will appreciate how these functions are implemented in accordance with the present invention. In addition, and as discussed above, it should be noted the name of the output signal of each flip-flop shares the name of the flip-flop (that is, signal B0 is the output of flip-flop B0, etc.). Signal connections are shown by naming convention in some cases and by routing convention in other cases.

The binary counter 10 shown in FIG. 7 includes single counting flip-flops B0, B1 for terms B0 and B1, as well as the additional implementations thereof as discussed below. Thereafter, the binary counter 10 employs a single counting flip-flop B2, B3, B4 and a single first AND gate D2, D3, D4 for terms B2, B3 and B4. Finally, and for all remaining terms Bn, the binary counter 10 employs a second AND gate C1–C27 provided with input from B3, . . . B(n−1), an input delay flip-flop A1–A27, a first AND gate D5–D31 provided with input from counting flip-flops B0, B1 and B2 and a counting T flip-flop B5–B31.

This example utilizes 3 implementations of the Least Significant bit signal (the $0^{th}$ term); B0 (401), B0' (402), B0" (403), and three implementations of the next to the Least Significant bit signal (the $1^{st}$ term); B1 (410), B1' (411) and, B1" (412). This is achieved by branching the system clock signal to three distinct branches respectively handling B0–B11, B12–B21 and B22–B31.

More specifically, the input signals for the input term first AND gates D3–D11 for terms B3–B11 are provided by counting flip-flops B0 and B1. This requires a fan-out of 10 for term B0 and a fan-out of 9 for term B1 (B1 also receives input from B0). The input signals for the input term first AND gates D12–D21 for terms B12–B21 are provided by counting flip-flops B0' and B1'. This requires a fan-out of 10 for term B0' and a fan-out of 9 for term B1' (B1' also receives input from B0'). The input signals for the input term first AND gates D22–D31 for terms B22–B31 are provided by counting flip-flops B0" and B1". This requires a fan-out of 10 for term B0" and a fan-out of 9 for term B1" (B1" also receives input from B0").

This organization allows the $0^{th}$-terms (B0, B0', B0") and $1^{th}$-terms (B1, B1', B1") to be routed on local routing resources which have much lower signal delay than global routing resources. This organization also allows efficient floor planning since each output term counting flip-flop B0–B31 is connected to a logic gate that is small enough to be implemented completely in the look up table in the same logic cell (with the flip-flop).

The input delay flip-flops A1–A27 that process the higher order input logic can be placed further away in the IC floor plan. B3 is the fastest signal that is a component of the input delay logic and changes 8 times slower than B0. Because of the limits of the input signals to the input delay flip-flops A1–A27, the outputs of these input delayed flip-flops A1–A27 change much more slowly than the outputs of the $0^{th}$-terms and $1^{th}$-terms and can be routed using resources with longer delays.

The result of combining redundant least significant terms with input factor delay is that counting flip-flop B31 has the similar input delay as counting flip-flop B2. The flip-flop delay includes one combinational logic term (small enough to be implemented in the Logic Cell's own look-up table) and transport delays from flip-flop outputs (register-to-register delays) that are minimized by use of close "local routing" resources.

Specifically, counting flip-flop B2 receives inputs from its local first AND gate D2. The first AND gate D2 at counting flip-flop B2 receives input from B0, B1, which are closely located counting flip-flops. Counting flip-flop B31 receives input from its local first AND gate D31. The first AND gate D31 receives input from counting flip-flops B0", B1" (both input delay flip-flops are relatively local) and B2 (which is allowed four clock cycles for transport delay) and input delay flip-flop A27 (which is allowed 7 clock cycles of delay but may be placed relatively close to counting flip-flop B31).

If the routing delay is still a problem for some gates, additional redundant $0^{th}$ and $1^{th}$-terms may be used in order to properly distribute signals according to silicon resources.

Also, it can be shown that many of the inputs to the input factor first AND gates D3–D31 are repetitive. For instance, signals B3, B4, B5 and B6 are all used for terms B7 through B31. These terms can be logically combined in one look-up table and the output of that look-up table used as an input for all appropriate terms, thereby economizing on resources. This duplicate logic gate reduction can be carried out throughout the design without negatively affecting counter speed because the counter speed is secured by the redundant least significant terms and input factor delay techniques.

Figure 8:
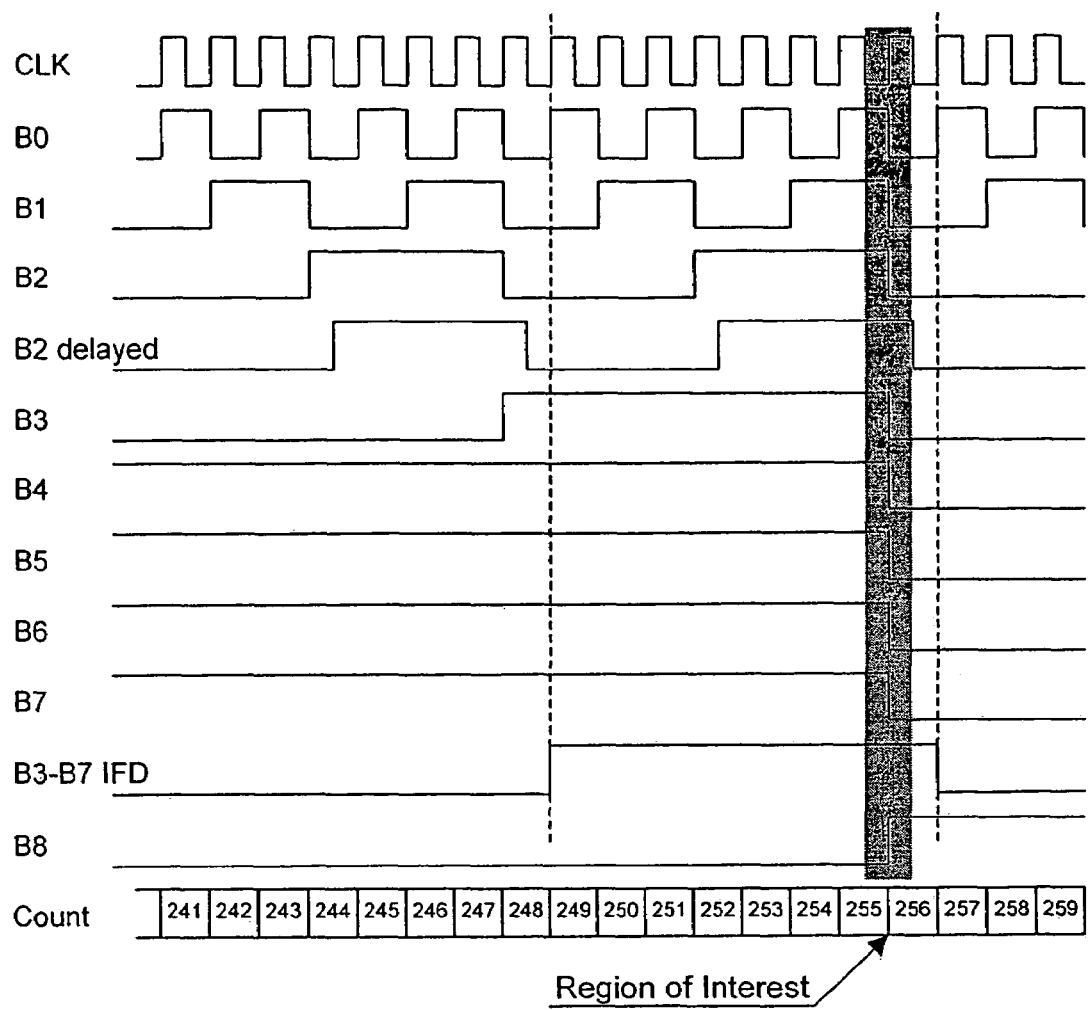
FIG. 8 shows a timing diagram example with input factor delay in accordance with the present invention.

A timing diagram of how the system works is shown in FIG. 8. For this illustration, we return to the example of the transition from count value 255 to 256. FIG. 8 adds a timing trace for a delayed value of B2 (B2 delayed) to demonstrate why this value is not as sensitive to routing delays as signals B0 and B1. B2 is already at the required value (logic high) four clock cycles before the critical transition must occur.

Because B2 is the output of a flip-flop B2, the signal is stable and glitch free. Signal "B2 delayed" may be over a clock cycle late without affecting counter performance. If "B2 delayed" is two clock cycles delayed (not counting flip-flop setup time) an invalid output could occur.

Next we consider the Input Factor Delay. Input terms B3 through B7 are combined using a logical AND gate then latched through a "D" flip-flop. The resulting signal trace is illustrated as "B3–B7 IFD". The logical value of "B3–B7

IFD" achieves the required value (logic high) seven clock cycles before the critical transition occurs.

"B3–B7 IFD" must return to logic low before signals B0, B1, and B2 all return to logic high. Nominally this condition dictates that the Input Factor Delay term return to low within two clock cycles if B2 is not routed well. If any one of the input terms to "B3–B7 IFD" becomes a logic low prior to the flip-flop setup and clock time, the "B3–B7 IFD" will return to zero (logic low) one clock cycle after the critical transition. The "return to zero" response of the Input Factor Delay term allows for more routing delay in the B2 term and guarantees that the system works uniformly regardless of the number of counter bits.

Those skilled in the art will understand the present high speed binary counter works regardless of the memory element used. In accordance with a preferred embodiment of the present invention, the high speed binary counter has been described with D flip-flops and T flip-flops. However, the underlying concepts of the present invention would work if the high speed binary counter were built with JK flip-flops, RS latches or other known elements.

It should be understood that a counter is simply a special case sequencer or state machine. A sequencer is composed of memory elements (flip-flops or some other memory device) and combinational logic used to determine the next state outputs of the memory elements. A sequencer is generally described as a special case state machine that completely determines its next state based upon its present state. The output terms are fed back into the combinational logic inputs. There are inputs that determine whether the sequencer operates or remains locked in a state (enable) and inputs used to set, reset or clear the sequencer. However, the next state of the sequencer is always determined by the present state. With this in mind, the present high speed binary counter is described in accordance with a preferred embodiment as a binary counter, although the underlying concept would work for any type of counter or sequencer. The present high speed binary counter works for gray code counters, although improvement with gray code counters is not as substantial as when the present system is implemented in a binary counter not having to convert from some other format to binary.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A high speed binary counter, comprising:
   a counting first flip-flop for each binary bit;
   a single AND gate for each lower order binary bit beyond B0 and B1;
   at least two AND gates for each higher order binary bit; and
   further including an input factor delay second flip-flop wherein each first flip-flop is a toggle flip-flop and each second flip-flop is a D-flip-flop.

2. The high speed binary counter according to claim 1, wherein each first flip-flop is a D flip-flop.

3. The high speed binary counter according to claim 1, wherein the lower order binary bits beyond B0 and B1 are B2, B3 and B4.

4. The high speed binary counter according to claim 3, wherein the higher order binary bits are B5 and above.

5. The high speed binary counter according to claim 1, wherein the higher order binary bits are B5 and above.

6. The high speed binary counter according to claim 1, further including means for redundant least significant terms for lesser order bits.

7. The high speed binary counter according to claim 6, wherein the means for redundant least significant terms includes replication of term B0 for all counter terms of the binary counter.

8. The high speed binary counter according to claim 6, wherein the means for redundant least significant terms includes replication of term B1 for all counter terms of the binary counter.

9. A high speed binary counter, comprising:
   a counting first flip-flop for each binary bit;
   a single AND gate for each lower order binary bit beyond B0 and B1; and
   a means for partial input factor delay for each higher order binary bit;
   wherein the means for partial input factor delay is a second AND gate applied to each higher order binary bit and an input factor delay second flip-flop.

10. The high speed binary counter according to claim 9, wherein each first flip-flop is a D flip-flop.

11. The high speed binary counter according to claim 10, wherein second flip-flop is a D flip-flop.

12. The high speed binary counter according to claim 9, wherein each first flip-flop is a toggle flip-flop.

13. The high speed binary counter according to claim 12, wherein second flip-flop is a D flip-flop.

14. The high speed binary counter according to claim 9, wherein the lower order binary bits are B2, B3 and B4.

15. The high speed binary counter according to claim 14, wherein the higher order binary bits are B5 and above.

16. The high speed binary counter according to claim 9, wherein the higher order binary bits are B5 and above.

17. The high speed binary counter according to claim 9, further including means for redundant least significant terms for lesser order bits.

18. The high speed binary counter according to claim 17, wherein the means for redundant least significant terms includes replication of term B0 for all counter terms of the binary counter.

19. The high speed binary counter according to claim 9, wherein each first flip-flop is a D flip-flop.

20. A high speed binary counter, comprising:
   a counting first flip-flop for each binary bit;
   a single AND gate for each lower order binary bit beyond B0 and B1;
   at least two AND gates for each higher order binary bit; and
   further including means for redundant least significant terms for lesser order bits.

21. The high speed binary counter according to claim 20, wherein each first flip-flop is a toggle flip-flop.

22. The high speed binary counter according to claim 20, wherein the lower order binary bits beyond B0 and B1 are B2, B3 and B4.

23. The high speed binary counter according to claim 22, wherein the higher order binary bits are B5 and above.

24. The high speed binary counter according to claim 20, wherein the higher order binary bits are B5 and above.

25. The high speed binary counter according to claim 20, wherein the means for redundant least significant terms includes replication of term B0 for all counter terms of the binary counter.

26. The high speed binary counter according to claim 20, wherein the means for redundant least significant terms includes replication of term B1 for all counter terms of the binary counter.

27. A high speed binary counter, comprising:
a counting first flip-flop for each binary bit;
a single AND gate for each lower order binary bit beyond B0 and B1; and
a means for partial input factor delay for each higher order binary bit;
wherein each first flip-flop is a D flip-flop and wherein the means for partial input factor delay is a second AND gate applied to each higher order binary bit and a second flip-flop which is a D flip-flop.

28. The high speed binary counter according to claim 27, wherein the lower order binary bits are B2, B3 and B4.

29. The high speed binary counter according to claim 28, wherein the higher order binary bits are B5 and above.

30. The high speed binary counter according to claim 27, wherein the higher order binary bits are B5 and above.

31. The high speed binary counter according to claim 27, further including means for redundant least significant terms for lesser order bits.

32. The high speed binary counter according to claim 31, wherein the means for redundant least significant terms includes replication of term B0 for all counter terms of the binary counter.

33. A high speed binary counter, comprising:
a counting first flip-flop for each binary bit;
a single AND gate for each lower order binary bit beyond B0 and B1; and
a means for partial input factor delay for each higher order binary bit;
wherein each first flip-flop is a toggle flip-flop and wherein the means for partial input factor delay is a second AND gate applied to each higher order binary bit and a second flip-flop which is a D flip-flop.

34. The high speed binary counter according to claim 33, wherein the lower order binary bits are B2, B3 and B4.

35. The high speed binary counter according to claim 34, wherein the higher order binary bits are B5 and above.

36. The high speed binary counter according to claim 33, wherein the higher order binary bits are B5 and above.

37. The high speed binary counter according to claim 33, further including means for redundant least significant terms for lesser order bits.

38. The high speed binary counter according to claim 37, wherein the means for redundant least significant terms includes replication of term B0 for all counter terms of the binary counter.

39. The high speed binary counter according to claim 37, wherein the means for redundant least significant terms includes replication of term B0 for all counter terms of the binary counter.

40. A high speed binary counter, comprising:
a counting first flip-flop for each binary bit;
a single AND gate for each lower order binary bit beyond B0 and B1; and
a means for partial input factor delay for each higher order binary bit; and
further including means for redundant least significant terms for lesser order bits.

* * * * *